(12) United States Patent  (10) Patent No.: US 7,598,164 B2
Hirshberg  (45) Date of Patent: Oct. 6, 2009

(54) METHOD FOR DIRECT BONDING OF METALLIC CONDUCTORS TO A CERAMIC SUBSTRATE

(75) Inventor: Arnon Hirshberg, Haifa (IL)

(73) Assignee: Technion Research & Development Foundation Ltd., Haifa (IL)

( * ) Notice: Subject to any disclaimer, the term of this patent is extended or adjusted under 35 U.S.C. 154(b) by 105 days.

(21) Appl. No.: 11/869,749

(22) Filed: Oct. 10, 2007

(65) Prior Publication Data

US 2008/0156848 A1   Jul. 3, 2008

(51) Int. Cl.
*H01L 21/44* (2006.01)
(52) U.S. Cl. ...................................... 438/612; 438/614
(58) Field of Classification Search ......... 438/611–618, 438/E21.509
See application file for complete search history.

(56) References Cited

U.S. PATENT DOCUMENTS

| 6,507,112 | B1 * | 1/2003 | Kurihara et al. | 438/614 |
| 7,009,305 | B2 * | 3/2006 | Carberry | 438/613 |
| 7,202,565 | B2 * | 4/2007 | Matsuura et al. | 438/612 |
| 7,220,663 | B2 * | 5/2007 | Chopra et al. | 438/612 |

* cited by examiner

*Primary Examiner*—Cuong Q Nguyen
(74) *Attorney, Agent, or Firm*—Edward Langer

(57) ABSTRACT

A method to provide direct bonding of wires to silicon for microelectronic and micro-electromechanical systems (MEMS). The method includes preparing a rough "pothole" during one of the many deep etch steps already provided in MEMS fabrication. The method also includes roughening of the smooth silicon surface in and around the rough pothole and plastically deforming a ball-bond into the rough pothole, such that the interconnection will eliminate a costly metallization layer, and thereby lower fabrication expenses and allow high temperature processing.

16 Claims, 2 Drawing Sheets

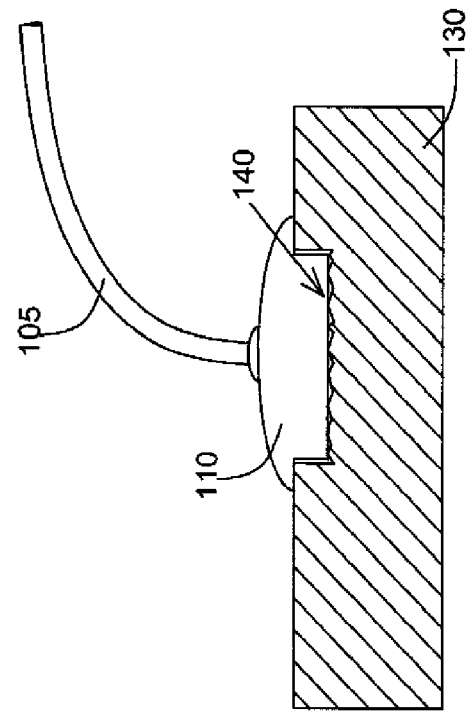
Fig. 1b
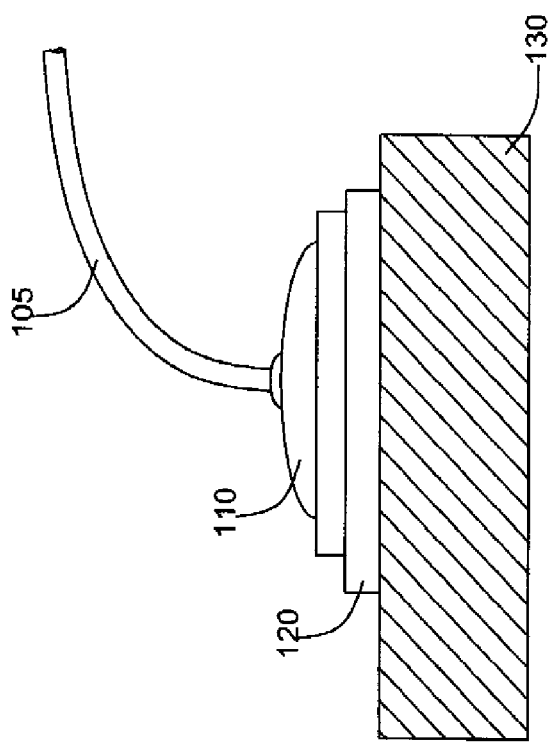
PRIOR ART Fig. 1a

METHOD FOR DIRECT BONDING OF METALLIC CONDUCTORS TO A CERAMIC SUBSTRATE

FIELD OF THE INVENTION

The present invention relates generally to methods for bonding conductors, and more particularly to a method for direct bonding of metallic conductors to a ceramic substrate in microelectronic and MicroElectroMechanical Systems (MEMS) applications.

BACKGROUND OF THE INVENTION

Wire bonding is a method of making interconnections between a micro device and the outside world as part of semiconductor device fabrication. Wire bonding is used to electrically connect a microchip to its substrate or package. This procedure requires a metal pad on the microchip. Wire bonding is generally considered the most cost-effective and flexible interconnect technology, and is used to assemble the vast majority of semiconductor packages. In general, a gold wire is attached at both ends to a metallic layer, using some combination of heat, pressure, and ultrasonic energy to make a weld. Prior art FIG. 1a is a schematic illustration of wire bonding showing wire 105 having a standard ball-bond 110 bonded to a metal pad 120 mounted on a Single Crystal Silicon (SCS) wafer 130.

MicroElectroMechanical Systems (MEMS) and micro devices are often fabricated using passivation layers. Passivation is the process of oxidation/nitridization of a material. The passivation layers are mostly used as hard masks and electric isolation. The process of passivation requires a high temperature, of up to 1200° C.

Due to the presence of metal layers which are used as conductors and bonding pads, the process temperature is limited to 400° C. This prevents any passivation processes where metal layers exist. In micro devices the conductors may be replaced by highly doped silicon, but there is no alternative for the bonding pads, because wire bonding cannot be performed on straight smooth silicon layers.

Thus, it would be desirable to provide an alternative method that does not require bonding pads, and is not performed on straight smooth silicon layers.

SUMMARY OF THE INVENTION

Accordingly, it is a principal object of the present invention to provide direct bonding of wires to silicon.

It is another principal object of the present invention to provide roughening of the smooth silicon surface.

It is a further principal object of the present invention to take advantage of the many deep etch steps that are already included in microtechnology fabrication, wherein one of these steps is preferably used to prepare rough "potholes" into which a ball-bond can be plastically deformed.

The success of such types of interconnection will eliminate the costly metallization layer, and may lower fabrication expenses. The method of the present invention can eliminate the costly metal evaporation process, e.g. gold physical vapor deposition (Au PVD). The method also enables further processing at high temperatures, which is normally precluded by the presence of the prior art gold, or other, metal layer.

A method is disclosed for providing direct bonding of wires to silicon for microelectronics and microelectromechanical systems (MEMS). The method includes preparing a rough "pothole" during one of the many deep etch steps already provided in MEMS fabrication. The method also includes roughening of the smooth silicon surface in and around the rough pothole and plastically deforming a ball-bond into the rough pothole, such that the interconnection will obviate a costly metallization layer, and thereby lower fabrication expenses.

There has thus been outlined, rather broadly, the more important features of the invention in order that the detailed description thereof that follows hereinafter may be better understood. Additional details and advantages of the invention will be set forth in the detailed description, and in part will be appreciated from the description, or may be learned by practice of the invention.

BRIEF DESCRIPTION OF THE DRAWINGS

For a better understanding of the invention with regard to the embodiments thereof, reference is now made to the accompanying drawings, in which like numerals designate corresponding elements or sections throughout, and in which:

FIG. 1a is a prior art schematic illustration of a wire bonding technique showing a standard ball-bond bonded to a metal pad;

FIG. 1b is a schematic illustration of a direct bond, constructed according to the principles of the present invention.

DETAILED DESCRIPTION OF A PREFERRED EMBODIMENT

Figure 2:
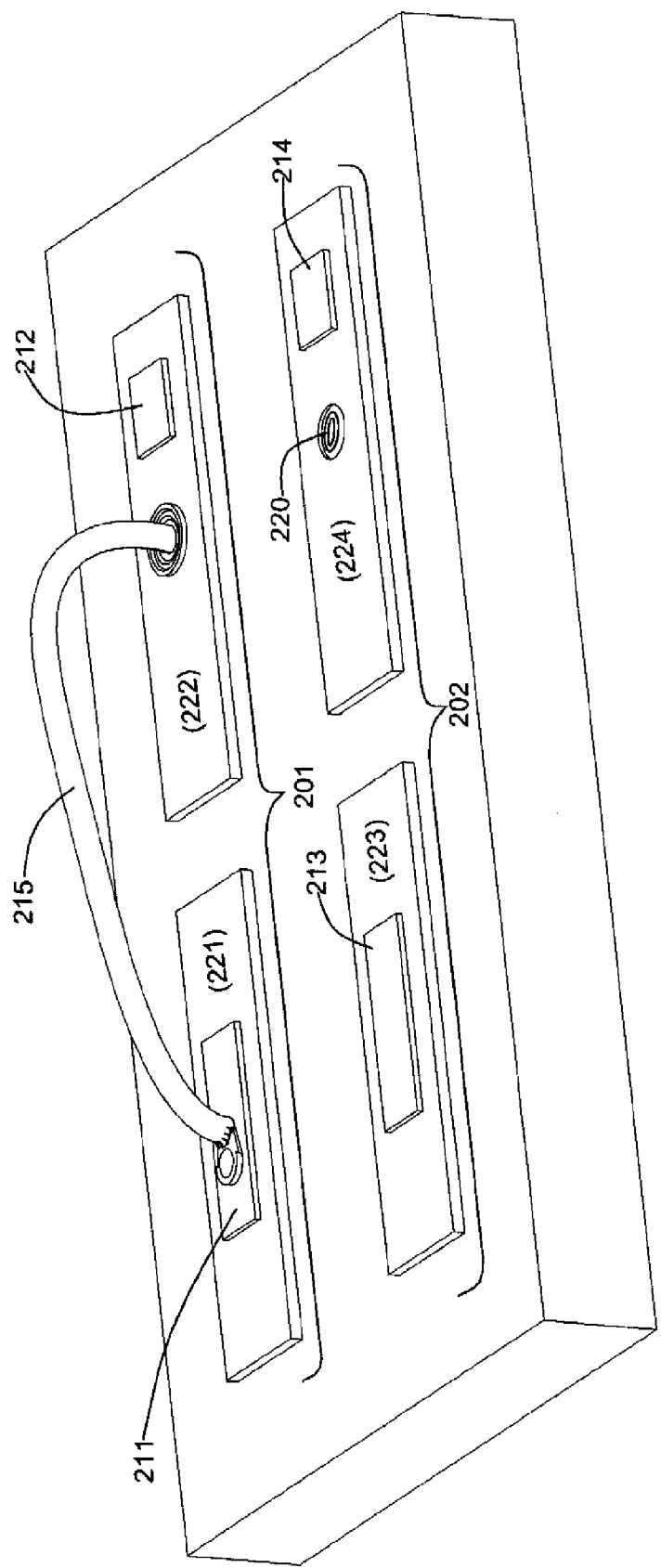
FIG. 2 is a schematic illustration superimposed on a microphotograph of a test structure with a wire bond directly attached to a silicon Deep Reactive Ion Etching (DRIE) pothole, according to the principles of the present invention.

The principles and operation of a method and an apparatus according to the present invention may be better understood with reference to the drawings and the accompanying description, it being understood that these drawings are given for illustrative purposes only and are not meant to be limiting.

FIG. 1b is a schematic illustration of a direct bond, constructed according to the principles of the present invention. As with prior art FIG. 1a, a wire 105 is shown connected by a ball-bond 110 on a single crystal silicon (SCS) wafer 130. However, the metallic layer of FIG. 1a is replaced with a shaped pothole 140 in the microchip material. Ball-bond 110 is then pressed and deforms into pothole 140 creating a mechanical and electrical connection.

Pothole 140 can be fabricated in any geometrical shape and size. Pothole 140 will preferably include a through hole as well.

Use of a pothole to improve the electrical-mechanical interconnection is presented by way of example only.

FIG. 2 is a schematic illustration superimposed on a microphotograph of a test structure with a wire bond directly attached to a silicon Deep Reactive Ion Etching (DRIE) pothole. There are two identical test structures built in a silicon-on-insulator (SOI) wafer. In the top test structure 201, a wire bond 215 is shown electrically connecting two isolated silicon "islands" 221 and 222. In the bottom test structure 202, the two isolated silicon islands 223 and 224 are not connected, in order to give an unimpeded view of the DRIE pothole 220. The pairs of metal pads 211-212 and 213-214 are used for measuring the electrical conductivity of the direct bond.

Having described the present invention with regard to certain specific embodiments thereof, it is to be understood that the description is not meant as a limitation, since further modifications will now suggest themselves to those skilled in the art, and it is intended to cover such modifications as fall within the scope of the appended claims.

I claim:

1. A method for providing direct bonding of wires to silicon for microelectronics and microelectromechanical systems (MEMS), said method comprising:
   preparing a rough pothole during one of the many deep etch steps already performed in microelectronics and MEMS fabrication;
   roughening of the smooth silicon surface in and around said rough pothole; and
   plastically deforming a ball-bond into said rough pothole, such that the interconnection will eliminate a costly metallization layer, and thereby lower fabrication expenses and enable further high temperature processing.

2. The method according to claim 1, wherein the metallization layer eliminated is a gold layer.

3. The method according to claim 1, wherein the metallization layer eliminated is an aluminum layer.

4. The method according to claim 1, wherein the method is part of semiconductor device fabrication.

5. The method according to claim 4, wherein said fabrication uses passivation layers.

6. The method according to claim 5, wherein the passivation layers are used as hard masks.

7. The method according to claim 5, wherein the passivation layers are used as electric isolation.

8. The method according to claim 1, wherein said pothole is a silicon Deep Reactive Ion Etching (DRIE) pothole.

9. A system for providing direct bonding of wires to silicon for microelectronics and microelectromechanical systems (MEMS), said system comprising:
   means for preparing a rough pothole during one of the many deep etch steps already performed in microelectronics and MEMS fabrication;
   means for roughening of the smooth silicon surface in and around said rough pothole; and
   means for plastically deforming a ball-bond into said rough pothole, such that the interconnection will eliminate a costly metallization layer, and thereby lower fabrication expenses and enable further high temperature processing.

10. The system according to claim 9, wherein the metallization layer eliminated is a gold layer.

11. The method according to claim 1, wherein the metallization layer eliminated is an aluminum layer.

12. The system according to claim 9, wherein the system is part of semiconductor device fabrication.

13. The system according to claim 12, wherein said fabrication uses passivation layers.

14. The system according to claim 13, wherein the passivation layers are used as hard masks.

15. The system according to claim 13, wherein the passivation layers are used as electric isolation.

16. The system according to claim 9, wherein said pothole is a silicon Deep Reactive Ion Etching (DRIE) pothole.

* * * * *

UNITED STATES PATENT AND TRADEMARK OFFICE
CERTIFICATE OF CORRECTION

| | | |
|---|---|---|
| PATENT NO. | : 7,598,164 B2 | Page 1 of 1 |
| APPLICATION NO. | : 11/869749 | |
| DATED | : October 6, 2009 | |
| INVENTOR(S) | : Arnon Hirshberg and David Elata | |

It is certified that error appears in the above-identified patent and that said Letters Patent is hereby corrected as shown below:

In the Title Page, at Field (75) Inventors, the following should appear:

Inventor: Arnon Hirshberg, Haifa (IL); --David Elata, Haifa (IL)--

Signed and Sealed this
Fourteenth Day of February, 2012

David J. Kappos
*Director of the United States Patent and Trademark Office*